United States Patent
Kubota et al.

(10) Patent No.: US 11,087,960 B2
(45) Date of Patent: *Aug. 10, 2021

(54) RADIO FREQUENCY POWER SOURCE AND PLASMA PROCESSING APPARATUS

(71) Applicant: Tokyo Electron Limited, Tokyo (JP)

(72) Inventors: Shinji Kubota, Miyagi (JP); Takashi Dokan, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 5 days.

This patent is subject to a terminal disclaimer.

(21) Appl. No.: 16/773,800

(22) Filed: Jan. 27, 2020

(65) Prior Publication Data

US 2020/0251308 A1 Aug. 6, 2020

(30) Foreign Application Priority Data

Feb. 5, 2019 (JP) .............................. JP2019-018831

(51) Int. Cl.
*H01J 37/32* (2006.01)

(52) U.S. Cl.
CPC .. *H01J 37/32165* (2013.01); *H01J 37/32128* (2013.01); *H01J 37/32183* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 6,400,996 B1* | 6/2002 | Hoffberg | G05B 19/0426 370/218 |
| 8,583,263 B2* | 11/2013 | Hoffberg | G05B 15/02 700/17 |
| 9,209,840 B2* | 12/2015 | Cox | H04B 1/525 |
| 9,355,822 B2* | 5/2016 | Yamada | H01J 37/32165 |
| 9,947,514 B2* | 4/2018 | Radomski | H01J 37/32155 |
| 10,217,609 B2* | 2/2019 | Fisk, II | H01J 37/32146 |
| 10,217,612 B2* | 2/2019 | Kubota | H01J 37/32302 |
| 10,361,802 B1* | 7/2019 | Hoffberg-Borghesani | G11B 27/11 |

(Continued)

FOREIGN PATENT DOCUMENTS

JP 2013-135159 A 7/2013

*Primary Examiner* — Amy Cohen Johnson
*Assistant Examiner* — Srinivas Sathiraju
(74) *Attorney, Agent, or Firm* — Studebaker & Brackett PC

(57) ABSTRACT

A radio frequency power source according to an exemplary embodiment includes a power generator configured to generate radio frequency power. The radio frequency power includes a plurality of power components. The plurality of power components respectively have a plurality of frequencies set symmetrically with respect to a fundamental frequency at an interval of a predetermined frequency. The envelope of the radio frequency power has peaks that periodically appear at a time interval defined by the predetermined frequency or a frequency that is a multiple of twice or more the predetermined frequency. The power level of the radio frequency power is set to be zero in a period excluding a period between a zero-cross region of the envelope immediately before a point in time of appearance of each of the peaks and a zero-cross region of the envelope immediately after the point in time of the appearance.

10 Claims, 10 Drawing Sheets

(56) References Cited

U.S. PATENT DOCUMENTS

| | | | |
|---|---|---|---|
| 2003/0218955 A1* | 11/2003 | Isshiki | G11B 7/24088 369/59.21 |
| 2011/0069784 A1* | 3/2011 | Petilli | H03M 3/496 375/296 |
| 2014/0361690 A1* | 12/2014 | Yamada | H01J 37/32155 315/111.21 |
| 2015/0364300 A1* | 12/2015 | Galli | H01J 37/32917 427/8 |
| 2016/0267769 A1* | 9/2016 | Rokhsaz | H01Q 9/04 |
| 2017/0062187 A1* | 3/2017 | Radomski | H01J 37/32155 |
| 2017/0103874 A1* | 4/2017 | Kaneko | H01J 37/32935 |
| 2017/0365445 A1* | 12/2017 | Kubota | H01J 37/32715 |
| 2018/0090301 A1* | 3/2018 | Kubota | H01J 37/32293 |
| 2018/0151332 A1* | 5/2018 | Kaneko | H01J 37/32311 |
| 2018/0211818 A1* | 7/2018 | Kubota | H01J 37/32311 |
| 2019/0057844 A1* | 2/2019 | Kaneko | H01J 37/32146 |
| 2019/0148112 A1* | 5/2019 | Kaneko | G01R 23/02 156/345.24 |
| 2019/0148115 A1* | 5/2019 | Kubota | H01L 21/31 315/111.21 |
| 2019/0154439 A1* | 5/2019 | Binder | G01S 15/08 |
| 2019/0306923 A1* | 10/2019 | Xiong | H04W 72/042 |
| 2019/0341228 A1* | 11/2019 | Kaneko | H05H 1/46 |
| 2020/0035462 A1* | 1/2020 | Kaneko | H01P 3/06 |
| 2020/0212943 A1* | 7/2020 | Banin | H04B 1/04 |
| 2020/0251308 A1* | 8/2020 | Kubota | H01J 37/32183 |
| 2020/0294770 A1* | 9/2020 | Kubota | H01J 37/32091 |

* cited by examiner

RADIO FREQUENCY POWER SOURCE AND PLASMA PROCESSING APPARATUS

CROSS-REFERENCE TO RELATED APPLICATIONS

This application is based on and claims the benefit of priority from Japanese Patent Application No. 2019-018831 filed on Feb. 5, 2019, the entire contents of which are incorporated herein by reference.

FIELD

Exemplary embodiments of the present disclosure relate to a radio frequency power source and a plasma processing apparatus.

BACKGROUND

A plasma processing apparatus is used in plasma processing on a substrate. The plasma processing apparatus is provided with a chamber and a radio frequency power source. The substrate is accommodated in the chamber. A gas is supplied into the chamber for the plasma processing. In order to generate a plasma from the gas, radio frequency power is supplied by the radio frequency power source. The radio frequency power may be periodically supplied as pulsed radio frequency power, as described in Japanese Patent Application Laid-Open Publication No. 2013-135159. In the plasma processing apparatus disclosed in the literature, the radio frequency power is periodically supplied as a rectangular pulse.

SUMMARY

In an exemplary embodiment, a radio frequency power source for a plasma processing apparatus is provided. The radio frequency power source includes a power generator and an output. The power generator is configured to generate radio frequency power. The output is configured to output the radio frequency power generated by the power generator. The radio frequency power includes a plurality of power components. The plurality of power components have a plurality of frequencies, respectively. The plurality of frequencies are set symmetrically with respect to a fundamental frequency at an interval of a predetermined frequency. An envelope of the radio frequency power has peaks that periodically appear at a time interval which is defined by the predetermined frequency or a frequency that is a multiple of twice or more the predetermined frequency. A power level of the radio frequency power is set to be zero in a period excluding a period between a zero-cross region of the envelope immediately before a point in time of appearance of each of the peaks and a zero-cross region of the envelope immediately after the point in time of the appearance.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
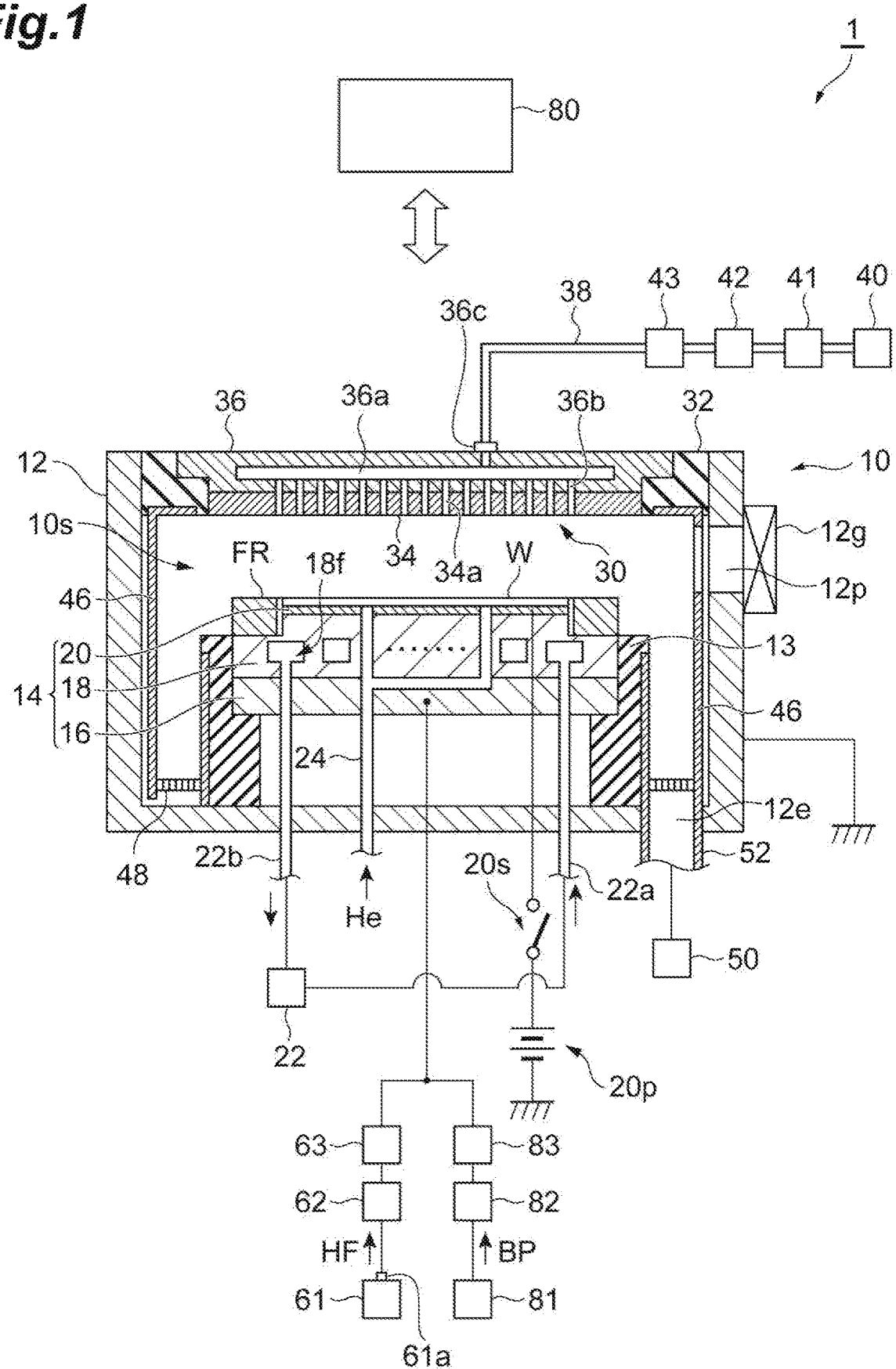
FIG. 1 is a diagram schematically showing a plasma processing apparatus according to an exemplary embodiment.

Hereinafter, various exemplary embodiments will be described.

In an exemplary embodiment, a radio frequency power source for a plasma processing apparatus is provided. The radio frequency power source includes a power generator and an output. The power generator is configured to generate radio frequency power. The output is configured to output the radio frequency power generated by the power generator. The radio frequency power includes a plurality of power components. The plurality of power components have a plurality of frequencies, respectively. The plurality of frequencies are set symmetrically with respect to a fundamental frequency at an interval of a predetermined frequency. An envelope of the radio frequency power has peaks that periodically appear at a time interval which is defined by the predetermined frequency or a frequency that is a multiple of twice or more the predetermined frequency. A power level of the radio frequency power is set to be zero in a period excluding a period between a zero-cross region of the envelope immediately before a point in time of appearance of each of the peaks and a zero-cross region of the envelope immediately after the point in time of the appearance.

In the embodiment described above, the radio frequency power is periodically generated as pulsed radio frequency power. That is, the radio frequency power includes pulses that periodically appear at a time interval described above. Each pulse has a power level that gradually increases to the peak thereof. Further, each pulse has a power level that gradually decreases from the peak thereof. Further, the power level of the radio frequency power is set to zero in the period excluding the period between the zero-cross region immediately before each pulse and the zero-cross region immediately after each pulse, that is, a period excluding the duration of each pulse. The zero-cross region may be a point in time when the amplitude of the envelope of the radio frequency power has a value that can be regarded as substantially zero. Therefore, according to the embodiment described above, it becomes possible to narrow the bandwidth of the pulsed radio frequency power which is generated periodically.

In an exemplary embodiment, the power generator may include a waveform data generator, a quantizer, an inverse Fourier transformer, and a modulator. The quantizer is configured to quantize waveform data generated by the waveform data generator to generate quantized data. The inverse Fourier transformer is configured to generate I data and Q data by applying inverse Fourier transform to the quantized data. The modulator is configured to generate a modulated radio frequency signal by modulating two reference radio frequency signals of which phases are different from each other by 90° by using the I data and the Q data. In this embodiment, the power generator is configured to generate the radio frequency power from the modulated radio frequency signal.

In an exemplary embodiment, the power generator may further include an amplifier configured to amplify the modulated radio frequency signal to generate the radio frequency power.

In an exemplary embodiment, the power generator may include a plurality of signal generators, an adder, and a switching circuit. The plurality of signal generators are configured to generate a plurality of radio frequency signals, respectively. The plurality of radio frequency signals have the plurality of frequencies, respectively. The adder is configured to add the plurality of radio frequency signals to generate a composite signal. An envelope of the composite signal has peaks that periodically appear at the time interval. The switching circuit is configured to generate a modulated radio frequency signal from the composite signal. The modulated radio frequency signal is set such that an amplitude level thereof is zero in a period excluding a period between a zero-cross region of the envelope of the composite signal immediately before a point in time of appearance of each of the peaks of the envelope of the composite signal and a zero-cross region of the envelope of the composite signal immediately after the point in time of the appearance. In this embodiment, the power generator is configured to generate the radio frequency power from the modulated radio frequency signal generated by the switching circuit.

In an exemplary embodiment, the power generator may further include an amplifier configured to amplify the modulated radio frequency signal generated by the switching circuit to generate the radio frequency power.

In another exemplary embodiment, a plasma processing apparatus is provided. The plasma processing apparatus includes a chamber, a substrate support, and a radio frequency power source. The substrate support has a lower electrode. The substrate support is configured to support a substrate in the chamber. The radio frequency power source is configured to generate radio frequency power to generate a plasma from a gas in the chamber. The radio frequency power source is the radio frequency power source according to any one of various exemplary embodiments described above.

In an exemplary embodiment, the plasma processing apparatus may further include a bias power source. The bias power source is electrically connected to the lower electrode and configured to generate radio frequency bias power to draw ions into the substrate support. A frequency of the radio frequency bias power is the predetermined frequency described above. In this embodiment, by setting a supply period of the pulsed radio frequency power in a cycle of the radio frequency bias power, it is possible to adjust the energy of ions which are supplied to the substrate.

In an exemplary embodiment, the plasma processing apparatus may further include a controller configured to set a phase difference between the radio frequency power and the radio frequency bias power.

In an exemplary embodiment, the plasma processing apparatus may further include a bias power source. The bias power source is electrically connected to the lower electrode and configured to repeatedly generate a pulsed direct-current voltage to draw ions into the substrate support. A repetition frequency of the pulsed direct-current voltage is the predetermined frequency described above. In this embodiment, by setting a supply period of the pulsed radio frequency power in a cycle which is defined by a predetermined frequency, it is possible to adjust the energy of ions which are supplied to the substrate.

In an exemplary embodiment, the plasma processing apparatus may further include a controller configured to set a phase difference between the radio frequency power and the pulsed direct-current voltage.

Hereinafter, various embodiments will be described in detail with reference to the drawings. In the drawing, the same or equivalent portions are denoted by the same reference symbols.

FIG. 1 is a diagram schematically showing a plasma processing apparatus according to an exemplary embodiment. A plasma processing apparatus 1 shown in FIG. 1 is a capacitively coupled plasma processing apparatus. The plasma processing apparatus 1 is provided with a chamber 10. The chamber 10 provides an internal space 10s therein.

The chamber 10 includes a chamber body 12. The chamber body 12 has a substantially cylindrical shape. The internal space 10s is provided inside the chamber body 12. The chamber body 12 is formed of, for example, aluminum. A film having corrosion resistance is provided on the inner wall surface of the chamber body 12. The film having corrosion resistance may be a film formed of ceramic such as aluminum oxide or yttrium oxide.

A passage 12p is formed in the side wall of the chamber body 12. A substrate W passes through the passage 12p when it is transferred between the internal space 10s and the outside of the chamber 10. The passage 12p is made to be able to be opened and closed by a gate valve 12g. The gate valve 12g is provided along the side wall of the chamber body 12.

A support 13 is provided on a bottom portion of the chamber body 12. The support 13 is formed of an insulating material. The support 13 has a substantially cylindrical shape. The support 13 extends upward from the bottom portion of the chamber body 12 in the internal space 10s. The support 13 supports a substrate support 14. The substrate support 14 is configured to support the substrate W in the internal space 10s.

The substrate support 14 includes a lower electrode 18 and an electrostatic chuck 20. The substrate support 14 may further include an electrode plate 16. The electrode plate 16, the lower electrode 18, and the electrostatic chuck 20 are provided in the chamber 10. The electrode plate 16 is formed of a conductor such as aluminum, for example, and has a substantially disk shape. The lower electrode 18 is provided on the electrode plate 16. The lower electrode 18 is formed of a conductor such as aluminum, for example, and has a substantially disk shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 has a main body and an electrode. The main body of the electrostatic chuck 20 has a substantially disk shape and is formed of a dielectric. The electrode of the electrostatic chuck 20 is a film-shaped electrode and is provided in the main body of the electrostatic chuck 20. The electrode of the electrostatic chuck 20 is connected to a direct-current power source 20p through a switch 20s. When the voltage from the direct-current power source 20p is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

A focus ring FR is mounted on a peripheral edge portion of the substrate support 14. The focus ring FR is provided in order to improve the in-plane uniformity of plasma processing on the substrate W. The focus ring FR is substantially plate-shaped and annular. The focus ring FR may be formed of silicon, silicon carbide, or quartz, but not limited thereto. The substrate W is disposed on the electrostatic chuck 20 and in a region surrounded by the focus ring FR.

A flow path 18f is provided in the interior of the lower electrode 18. A heat exchange medium (for example, a refrigerant) is supplied from a chiller unit 22 provided outside the chamber 10 to the flow path 18f through a pipe 22a. The heat exchange medium supplied to the flow path 18f is returned to the chiller unit 22 through a pipe 22b. In the plasma processing apparatus 1, the temperature of the substrate W placed on the electrostatic chuck 20 is adjusted by the heat exchange between the heat exchange medium and the lower electrode 18.

The plasma processing apparatus 1 is provided with a gas supply line 24. The gas supply line 24 supplies a heat transfer gas (for example, He gas) from a heat transfer gas supply mechanism to the gap between the upper surface of the electrostatic chuck 20 and the back surface of the substrate W.

The plasma processing apparatus 1 further includes an upper electrode 30. The upper electrode 30 is provided above the substrate support 14. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a top plate 34 and a support 36. The lower surface of the top plate 34 is a lower surface on the internal space 10s side and defines the internal space 10s. The top plate 34 may be formed of a low resistance conductor or semiconductor with low Joule heat. A plurality of gas discharge holes 34a are formed in the top plate 34. The plurality of gas discharge holes 34a penetrate the top plate 34 in a plate thickness direction thereof.

The support 36 detachably supports the top plate 34. The support 36 is formed of a conductive material such as aluminum. A gas diffusion chamber 36a is provided in the interior of the support 36. A plurality of gas holes 36b are formed in the support 36. The plurality of gas holes 36b extend downward from the gas diffusion chamber 36a. The plurality of gas holes 36b respectively communicate with the plurality of gas discharge holes 34a. A gas introduction port 36c is formed in the support 36. The gas introduction port 36c is connected to the gas diffusion chamber 36a. A gas supply pipe 38 is connected to the gas introduction port 36e.

A gas source group 40 is connected to the gas supply pipe 38 through a valve group 41, a flow rate controller group 42, and a valve group 43. The gas source group 40 includes a plurality of gas sources. Each of the valve group 41 and the valve group 43 includes a plurality of on-off valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

In the plasma processing apparatus 1, a shield 46 is detachably provided along the inner wall surface of the chamber body 12. The shield 46 is also provided on the outer periphery of the support 13. The shield 46 prevents an etching byproduct from adhering to the chamber body 12. The shield 46 is configured, for example, by forming a film having corrosion resistance on the surface of a member formed of aluminum. The film having corrosion resistance may be a film formed of ceramic such as yttrium oxide.

A baffle plate 48 is provided between the support 13 and the side wall of the chamber body 12. The baffle plate 48 is configured, for example, by forming a film having corrosion resistance on the surface of a member formed of aluminum. The film having corrosion resistance may be a film formed of ceramic such as yttrium oxide. A plurality of through-holes are formed in the baffle plate 48. An exhaust port 12e is provided below the baffle plate 48 and in the bottom portion of the chamber body 12. An exhaust device 50 is connected to the exhaust port 12e through an exhaust pipe 52. The exhaust device 50 has a pressure adjusting valve and a vacuum pump such as a turbo molecular pump.

Figure 2:
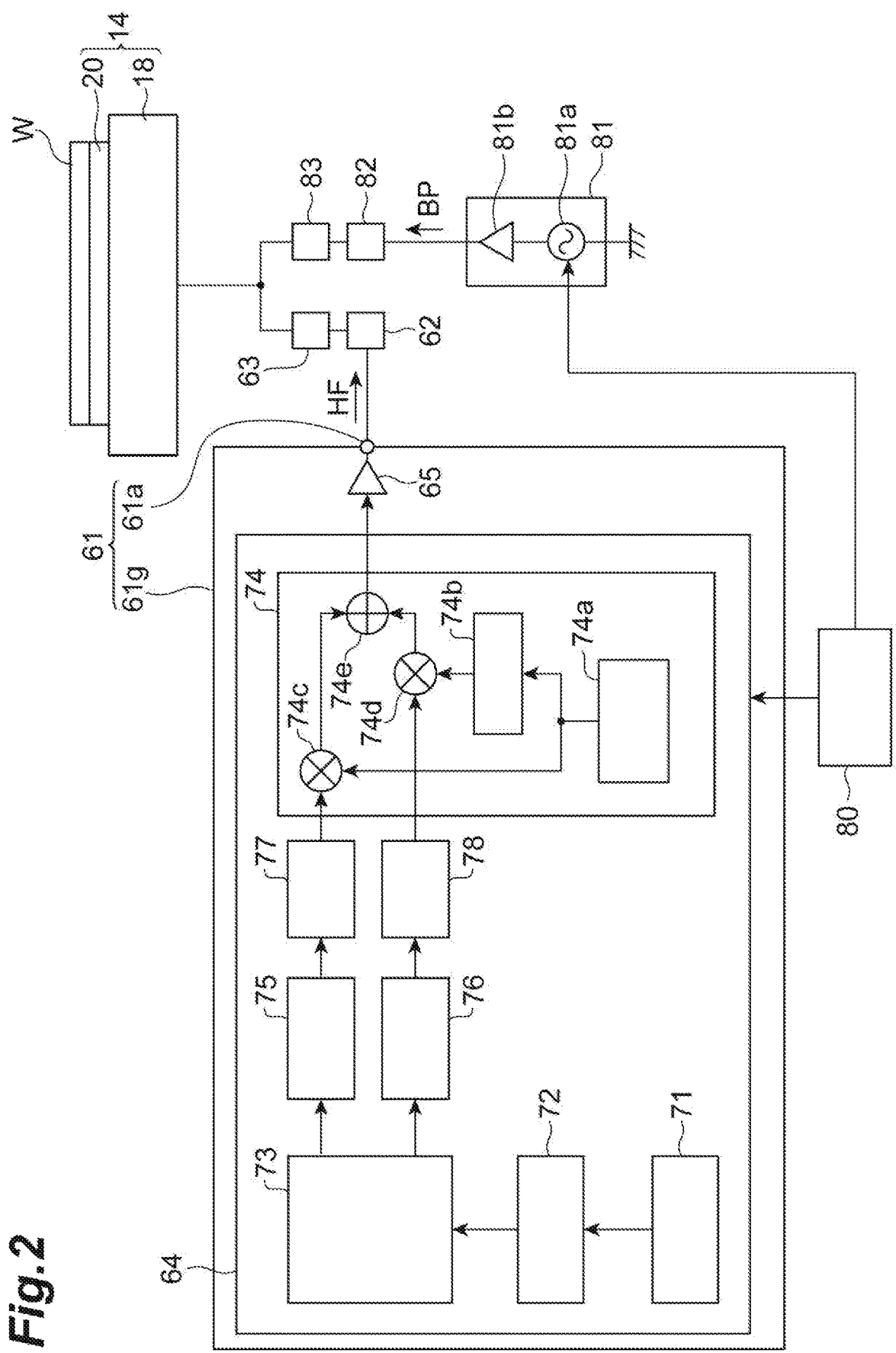
FIG. 2 is a diagram showing a configuration of a radio frequency power source according to an exemplary embodiment.

The plasma processing apparatus 1 further includes a radio frequency power source 61. FIG. 2 is a diagram showing a configuration of a radio frequency power source according to an exemplary embodiment. The radio frequency power source 61 includes a power generator 61g and an output 61a. The power generator 61g is configured to generate radio frequency power HF. The output 61a is configured to output the radio frequency power HF generated by the power generator 61g. The radio frequency power source 61 supplies the radio frequency power HF to generate a plasma from a gas in the chamber 10. The output 61a of the radio frequency power source 61 is electrically connected to the lower electrode 18 through a matcher 62. The matcher 62 has a matching circuit. The matching circuit of the matcher 62 is configured to match the impedance on the load side (lower electrode side) of the radio frequency power source 61 with the output impedance of the radio frequency power source 61. A filter 63 may be provided between the matcher 62 and the lower electrode 18. The filter 63 is configured to pass the radio frequency power HF and reduce or cut off other signals directed to the radio frequency power source 61. In another embodiment, the radio frequency power source 61 may be electrically connected to the upper electrode 30 through the matcher 62.

Figure 3A:
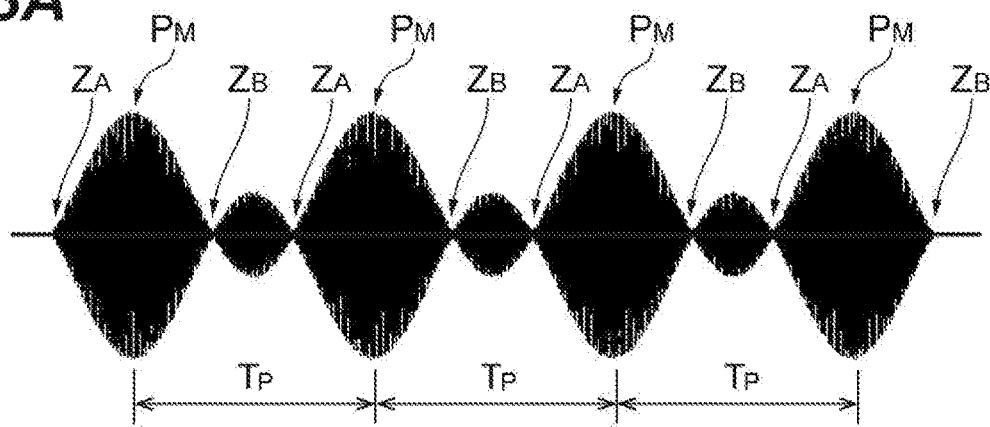
FIG. 3A is a diagram showing an example of a waveform of combined power of a plurality of power components.
Figure 3B:
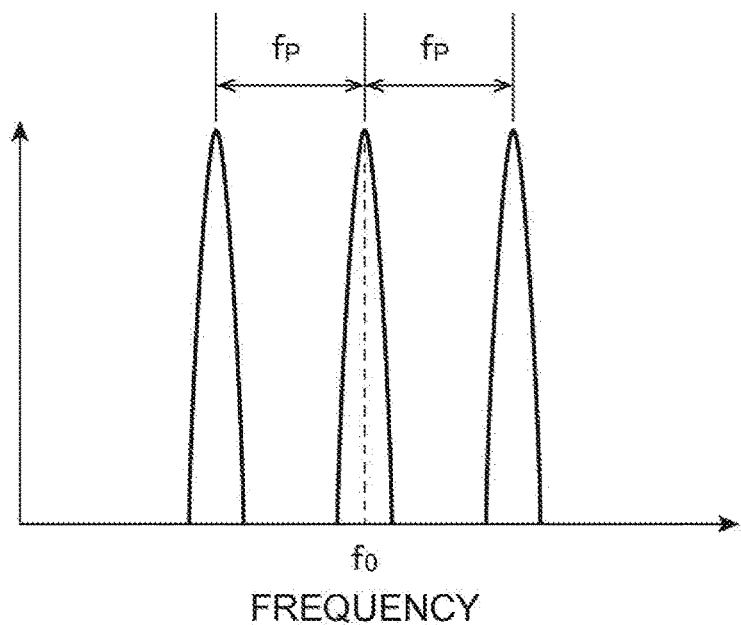
FIG. 3B is a diagram showing a power spectrum of the combined power shown in FIG. 3A.
Figure 3C:
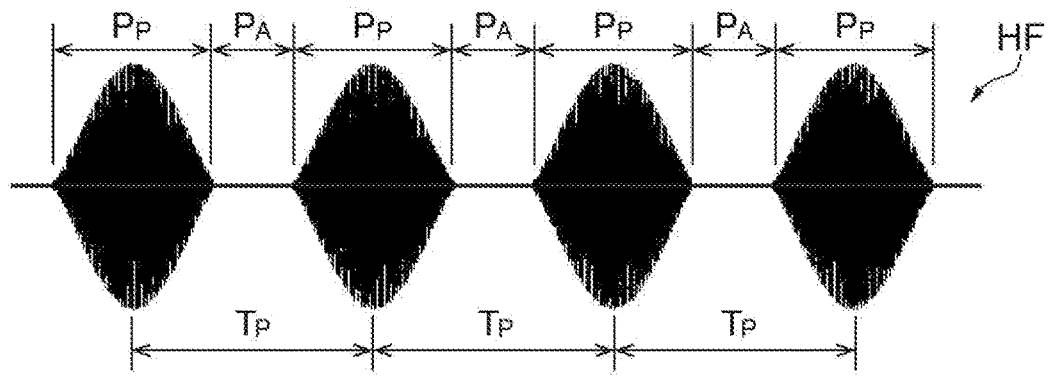
FIG. 3C is a diagram showing a waveform of radio frequency power HF of an example.

FIG. 3A is a diagram showing an example of a waveform of combined power of a plurality of power components, FIG. 3B is a diagram showing a power spectrum of the combined power shown in FIG. 3A, and FIG. 3C is a diagram showing a waveform of radio frequency power HF of an example. As shown in FIG. 3C, the radio frequency power HF is pulsed radio frequency power which is supplied periodically. That is, the radio frequency power HF includes pulses that appear periodically.

The radio frequency power HF includes a plurality of power components. The plurality of power components have a plurality of frequencies, respectively. As shown in FIG. 3B, the plurality of frequencies are set symmetrically with respect to a fundamental frequency $f_0$. The fundamental frequency $f_0$ is a frequency in a range of 27 MHz to 100 MHz, for example. In an example, the fundamental frequency $f_0$ is 40.68 MHz. Further, as shown in FIG. 3B, the plurality of frequencies are set at an interval of a predetermined frequency $f_P$. In the example shown in FIG. 3B, the respective frequencies of the plurality of power components are $f_0-f_P$, $f_0$, and $f_0+f_P$.

The envelope of the combined power of the plurality of power components includes a plurality of peak groups, as shown in FIG. 3A. Each of the plurality of peak groups includes a plurality of peaks that appear periodically. The plurality of peaks which are included in each of the plurality of peak groups periodically appear at a time interval $T_P$. The time interval $T_P$ is the reciprocal of the frequency $f_P$.

As shown in FIG. 3C, the envelope of the radio frequency power HF has peaks that appears at the time interval $T_P$. In an embodiment, the radio frequency power HF is composed of a peak group which includes peaks $P_M$ having the maximum power level among the plurality of peak groups. As shown in FIG. 3C, the radio frequency power HF is set such that the power level thereof is zero in periods $P_A$. The periods $P_A$ are periods excluding periods $P_P$. The periods $P_P$ are periods in which the peaks of the envelope of the radio frequency power HF appear, respectively. In an embodiment, the periods $P_1$ are periods in which peaks $P_M$ appear, respectively. Each of the periods $P_P$ is a period between a zero-cross region $Z_A$ of the envelope immediately before the point in time when a corresponding peak of the envelope of the radio frequency power HF appears and a zero-cross region $Z_B$ of the envelope immediately after the point in time of the appearance. The zero-cross region $Z_A$ and the zero-cross region $Z_B$ may be points in time at which the amplitude of the envelope of the radio frequency power HF has a value that can be regarded as substantially zero. For example, each of the zero-cross region $Z_A$ and the zero-cross region $Z_B$ may be a point in time at which the power level of the envelope has a power level of 30% or less or 10% or less with respect to the power level of the peak of the envelope of the radio frequency power HF.

Hereinafter, FIG. 2 will be referred to together with FIG. 1. In an embodiment, the power generator 61g may include a modulated signal generator 64, as shown in FIG. 2. In an embodiment, the power generator 61g may further include an amplifier 65. The modulated signal generator 64 generates a modulated radio frequency signal. The radio frequency power HF may be the modulated radio frequency signal which is generated by the modulated signal generator 64. In this case, the amplifier 65 is not necessary. Alternatively, the radio frequency power HF may be generated by amplifying the modulated radio frequency signal by the amplifier 65.

In an embodiment, the modulated signal generator 64 includes a waveform data generator 71, a quantizer 72, an inverse Fourier transformer 73, and a modulator 74. In an embodiment, the modulated signal generator 64 may further include D/A converters 75 and 76 and low-pass filters 77 and 78. The modulated signal generator 64 may be configured with, for example, an FPGA (Field-Programmable Gate Array). Alternatively, the modulated signal generator 64 may be formed of several circuits.

The waveform data generator 71 generates waveform data corresponding to the modulated radio frequency signal. The waveform data generator 71 is configured to acquire parameters (for example, a frequency, a phase, and the like) for generating the waveform data from the input device and generate the waveform data by using the acquired parameters. The waveform data generator 71 outputs the generated waveform data to the quantizer 72.

The quantizer 72 is configured to quantize the waveform data generated by the waveform data generator 71 to generate quantized data. The inverse Fourier transformer 73 is configured to generate I data (in-phase component) and Q data (quadrature phase component) by applying inverse Fourier transform to the quantized data. The I data and the Q data are input to the modulator 74 via the D/A converters 75 and 76 and the low-pass filters 77 and 78, respectively.

The modulator 74 is configured to generate a modulated radio frequency signal by modulating two reference radio frequency signals of which phases are different from each other by 90° by using the input I data and Q data, respectively.

In an embodiment, the modulator 74 includes a PLL oscillator 74a (Phase Locked Loop Oscillator), a phase shifter 74b, mixers 74c and 74d, and a synthesizer 74e.

The PLL oscillator 74a is configured to generate a reference radio frequency signal. The reference radio frequency signal is input to the mixer 74c. Further, the reference radio frequency signal is input to the phase shifter 74b. The phase shifter 74b is configured to generate a reference radio frequency signal having a phase that is different by 90° from the phase of the reference radio frequency signal which is input to the mixer 74c. Specifically, the phase shifter 74b is configured to shift the phase of the input reference radio frequency signal by 90°. The reference radio frequency signal generated by the phase shifter 74b is input to the mixer 74d.

The mixer 74c is configured to perform the multiplication of the input reference radio frequency signal and the I data. The signal generated by the multiplication of the mixer 74c is input to the synthesizer 74e. The mixer 74d is configured to perform the multiplication of the input reference radio frequency signal and the Q data. The signal generated by the multiplication of the mixer 74d is input to the synthesizer 74e. The synthesizer 74e is configured to add the signals input from the mixer 74c and the mixer 74d to generate the modulated radio frequency signal.

In an embodiment, the plasma processing apparatus 1 may further include a bias power source 81. The bias power source 81 is electrically connected to the lower electrode 18. In an embodiment, the bias power source 81 is configured to generate bias power BP to draw ions into the substrate support 14. The bias power BP is supplied to the lower electrode 18.

In an embodiment, the bias power source 81 may be configured to generate radio frequency bias power LF as the bias power BP. The frequency of the radio frequency bias power LF is lower than the fundamental frequency $f_0$. The frequency of the radio frequency bias power LF is, for example, a frequency in a range of 100 kHz to 13.56 MHz. In an example, the frequency of the radio frequency bias power LF is 400 kHz. In an embodiment, the frequency of the radio frequency bias power LF can be the frequency $f_r$ described above.

In an embodiment, the bias power source 81 may include a signal generator 81a and an amplifier 81b. The signal generator 81a is configured to generate a radio frequency signal having the same frequency as the frequency of the radio frequency bias power LF. The radio frequency signal generated by the signal generator 81a is input to the amplifier 81b. The amplifier 81b is configured to amplify the input radio frequency signal to generate the radio frequency bias power LF.

The bias power source 81 is electrically connected to the lower electrode 18 through a matcher 82. The matcher 82 has a matching circuit. The matching circuit of the matcher 82 is configured to match the impedance on the load side (lower electrode side) of the bias power source 81 with the output impedance of the bias power source 81. A filter 83 may be provided between the matcher 82 and the lower electrode 18. The filter 83 is configured to pass the bias power BP and reduce or cut off other signals directed to the bias power source 81.

In an embodiment, the plasma processing apparatus 1 may further include the controller 80. The controller 80 may be a computer which includes a processor, a storage unit such as a memory, an input device, a display device, a signal input/output interface, and the like. The controller 80 controls each part of the plasma processing apparatus 1. In the controller 80, an operator can perform a command input operation and the like by using the input device in order to manage the plasma processing apparatus 1. Further, in the controller 80, the operating status of the plasma processing apparatus 1 can be visualized and displayed by the display device. Further, a control program and recipe data are stored in the storage unit of the controller 80. The control program is executed by the processor of the controller 80 in order to execute various processing in the plasma processing apparatus 1. The processor of the controller 80 executes the control program and controls each part of the plasma processing apparatus 1 according to the recipe data, whereby plasma processing is executed in the plasma processing apparatus 1.

Figure 4A:
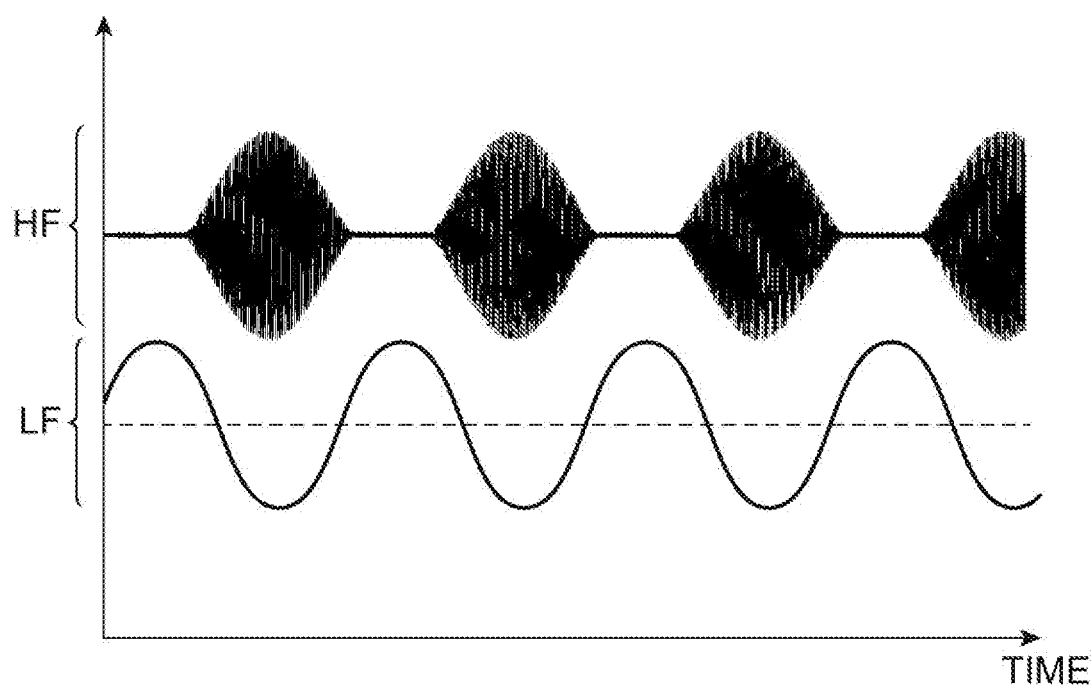
FIG. 4A is a diagram showing the waveform of radio frequency bias power LF of an example together with the waveform of the radio frequency power HF of the example shown in FIG. 3C.
Figure 4B:
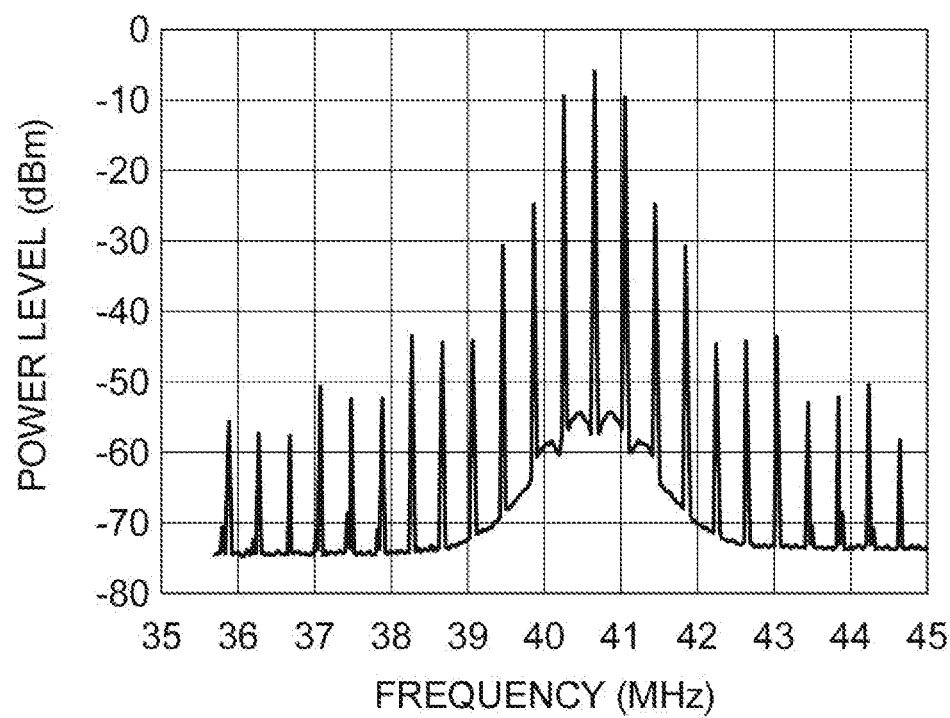
FIG. 4B is a diagram showing a power spectrum of the radio frequency power HF of an example.
Figure 5A:
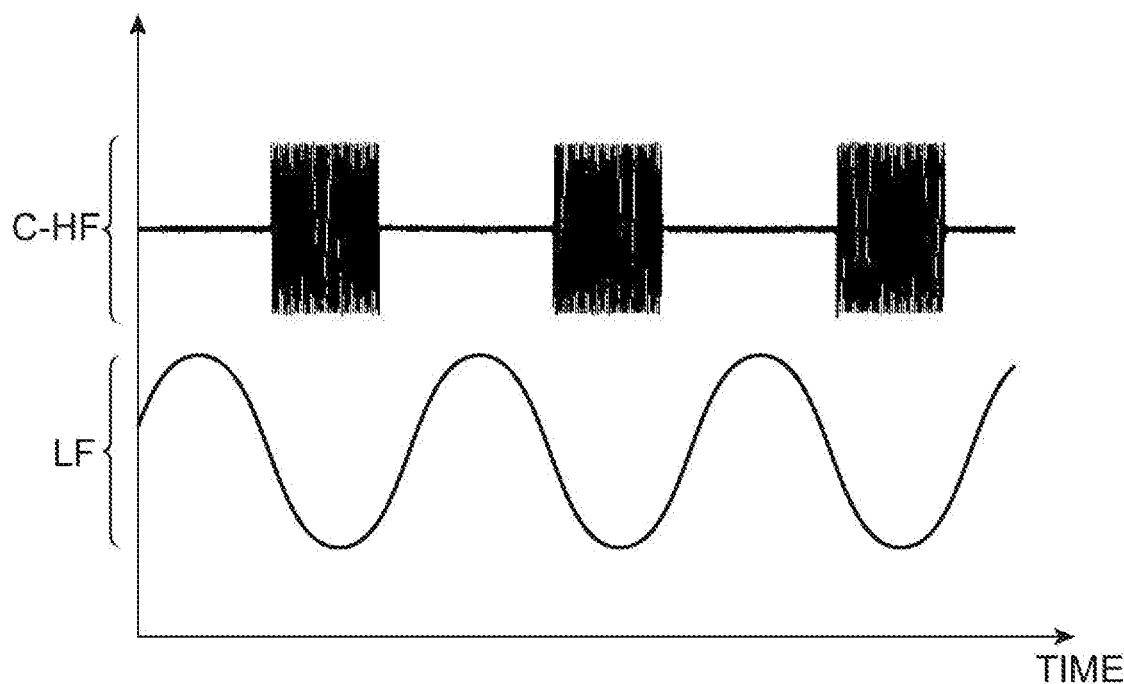
FIG. 5A is a diagram showing the waveform of the radio frequency bias power LF of an example together with a waveform of radio frequency power of a reference example.
Figure 5B:
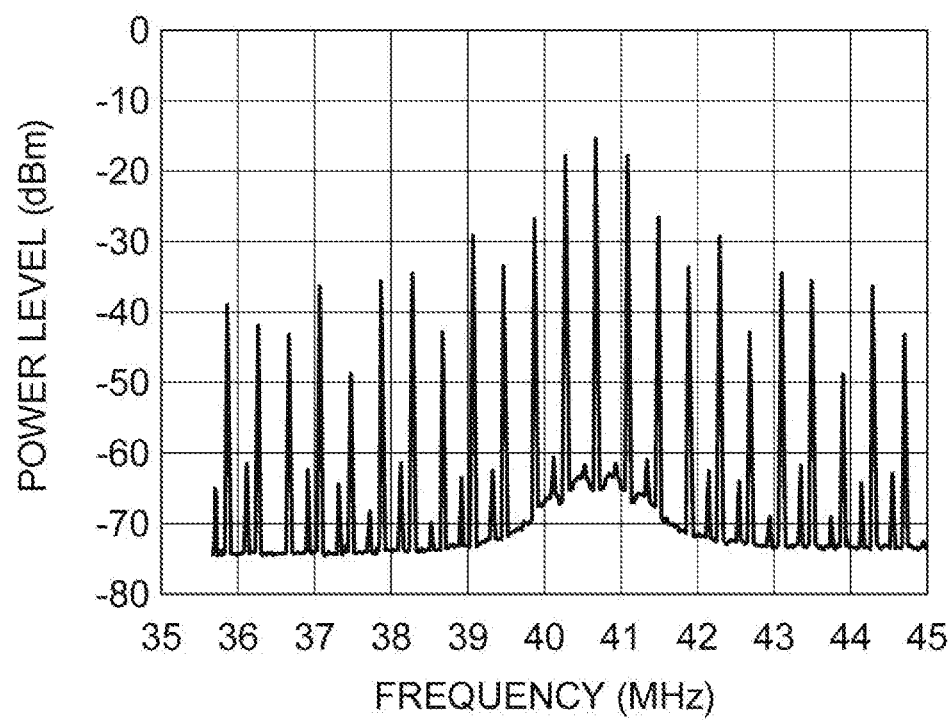
FIG. 5B is a diagram showing a power spectrum of the radio frequency power of the reference example.

FIG. 4A is a diagram showing the waveform of the radio frequency bias power LF of an example together with the waveform of the radio frequency power HF of an example shown in FIG. 3C, and FIG. 4B is a diagram showing a power spectrum of the radio frequency power HF of an example. The fundamental frequency $f_0$ of the radio frequency power HF shown in FIG. 4A is 40.68 MHz, and the frequency $f_P$ is 400 kHz. FIG. 5A is a diagram showing the waveform of the radio frequency bias power LF of an example together with a waveform of radio frequency power of a reference example, and FIG. 5B is a diagram showing a power spectrum of the radio frequency power of the reference example. Radio frequency power C-HF of the reference example shown in FIG. 5A is radio frequency power having a fundamental frequency of 40.68 MHz and is generated as a rectangular pulse that appears at a repetition frequency of 400 kHz.

As shown in FIG. 5B, the band of the radio frequency power C-HF which is supplied as a rectangular pulse is wide. Therefore, in a plasma processing apparatus using the radio frequency power C-HF, the power of a reflected wave increases, in a case where a frequency range in which a matching circuit performs impedance matching is narrow.

On the other hand, in the plasma processing apparatus 1, a gas is supplied into the chamber 10, and the radio frequency power HF is supplied to excite the gas in the chamber 10 and generate a plasma. The radio frequency power HF is periodically generated as pulsed radio frequency power. That is, the radio frequency power HF includes pulses that periodically appear at the time interval $T_P$. Each pulse has a power level that gradually increases to the peak thereof. Further, each pulse has a power level that gradually decreases from the peak thereof. In the period $P_A$ excluding the period $P_P$ between the zero-cross region $Z_A$ immediately before each pulse and the zero-cross region $Z_B$ immediately after each pulse, that is, the period excluding the duration of each pulse, the power level of the radio frequency power HF is set to zero. The bandwidth of the radio frequency power HF is narrow, as shown in FIG. 4B. Therefore, according to the radio frequency power source 61, it becomes possible to narrow the bandwidth of the pulsed radio frequency power HF which is generated periodically. Therefore, according to the plasma processing apparatus 1, even if the frequency range in which the matching circuit performs impedance matching is narrow, it becomes possible to suppress the reflected wave with respect to the radio frequency power HF.

In an embodiment, the frequency $f_P$ is the frequency of the radio frequency bias power LF. In this embodiment, the controller 80 may set a supply period (the period $P_P$) of the pulsed radio frequency power HF in a cycle of the radio frequency bias power LF.

Specifically, the radio frequency power source 61 and the bias power source 81 are synchronized with each other by a clock signal which is provided from the controller 80 or another controller. The controller 80 or another controller provides a signal for setting the phase of the radio frequency bias power LF to the bias power source 81 to set the phase difference between the radio frequency power HF and the radio frequency bias power LF. The bias power source 81 outputs the radio frequency bias power LF with a given phase. In this way, the supply period (the period $P_P$) of the pulsed radio frequency power HF in the cycle of the radio frequency bias power LF can be set. The controller 80 may provide a signal for setting the phase to the radio frequency power source 61 to set the phase of the radio frequency power HF instead of the radio frequency bias power LF.

In the plasma processing apparatus 1, by adjusting the supply period of the pulsed radio frequency power HF in the cycle of the radio frequency bias power LF, it is possible to adjust the energy of ions which are supplied to the substrate W. For example, if the pulsed radio frequency power HF is supplied in the period in which the radio frequency bias power LF which is output from the bias power source 81 has a positive voltage, the energy of ions which are supplied to the substrate W decreases. On the other hand, if the pulsed radio frequency power HF is supplied in the period in which the radio frequency bias power LF which is output from the bias power source 81 has a negative voltage, the energy of ions which are supplied to the substrate W increases.

Figure 6A:
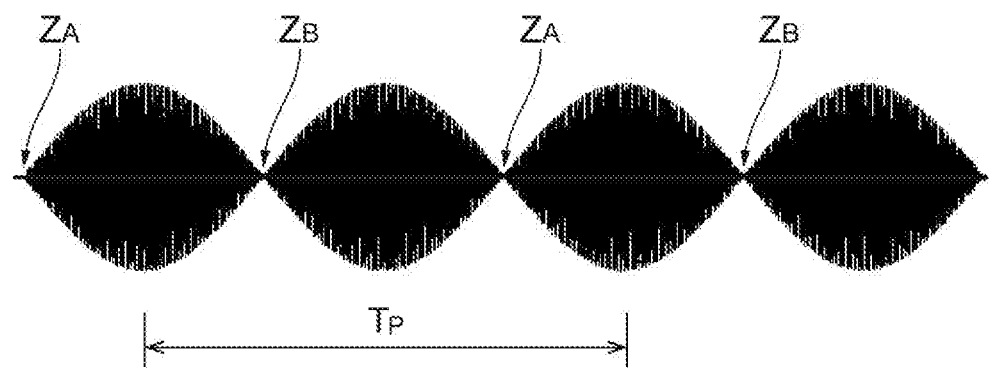
FIG. 6A is a diagram showing another example of a waveform of combined power of a plurality of power components.
Figure 6B:
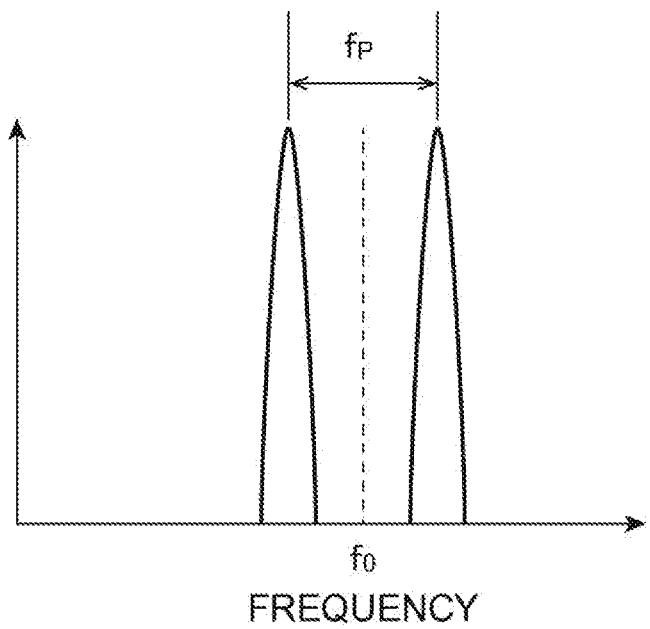
FIG. 6B is a diagram showing a power spectrum of the combined power shown in FIG. 6A.
Figure 6C:
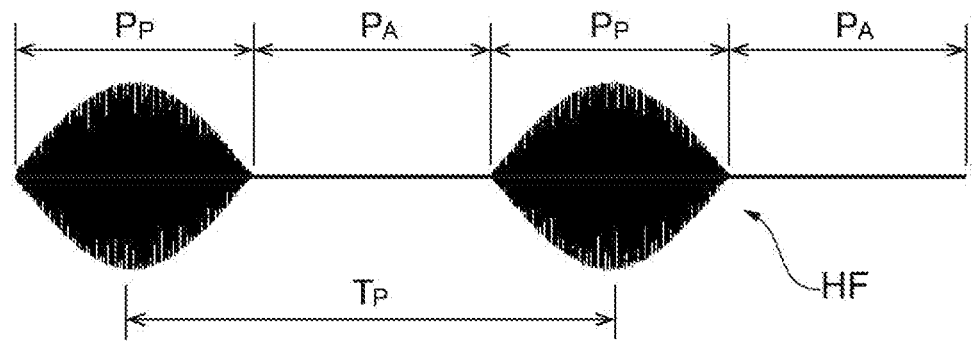
FIG. 6C is a diagram showing a waveform of radio frequency power HF of another example.

Hereinafter, FIGS. 6A, 6B, and 6C will be referred to. In another example, as shown in FIG. 6B, the frequencies of the plurality of power components of the radio frequency power HF are $f_0 - f_P/2$ and $f_0 + f_P/2$. In this example, as shown in FIGS. 6A and 6C, the time interval $T_P$ is defined by a frequency that is twice the frequency $f_P$. That is, the time interval $T_P$ may be the reciprocal of the frequency that is twice the frequency $f_P$. The time interval $T_P$ may be the reciprocal of a frequency that is an integral multiple of twice or more the frequency $f_P$.

Figure 7A:
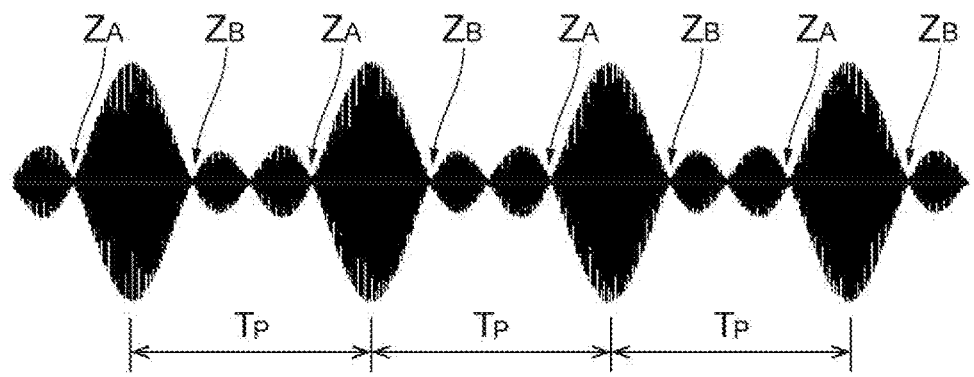
FIG. 7A is a diagram showing still another example of a waveform of a combined power of a plurality of power components.
Figure 7B:
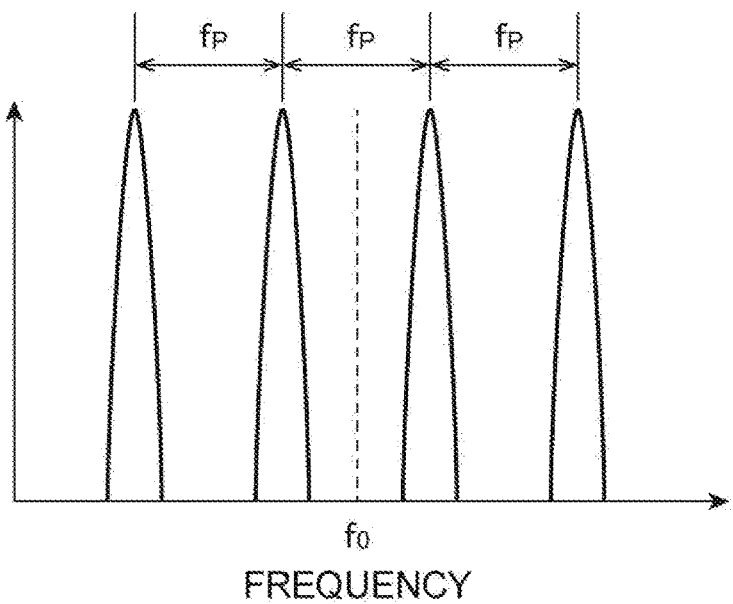
FIG. 7B is a diagram showing a power spectrum of the combined power shown in FIG. 7A.
Figure 7C:
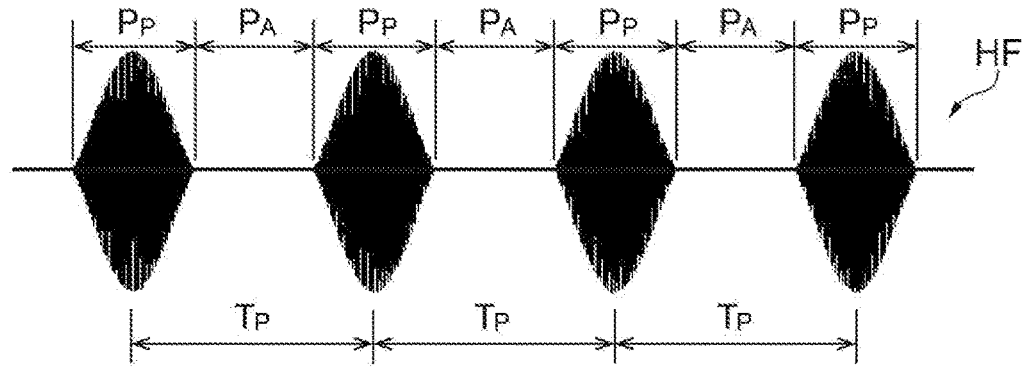
FIG. 7C is a diagram showing a waveform of radio frequency power HF of still another example.

Hereinafter, FIGS. 7A, 7B, and 7C will be referred to. In another example, as shown in FIG. 7B, the frequencies of the plurality of power components of the radio frequency power HF are $f_0-(3/2) \times f_P$, $f_P-f_P/2$, $f_0-f_P/2$, and $f_0+(3/2) \times f_P$. In this example, as shown in FIG. 7A, the envelope of the combined power of a plurality of power components includes three peak groups. In this example, as shown in FIG. 7C, the radio frequency power HF is composed of a peak group which includes the maximum peaks among the three peak groups.

Figure 8A:
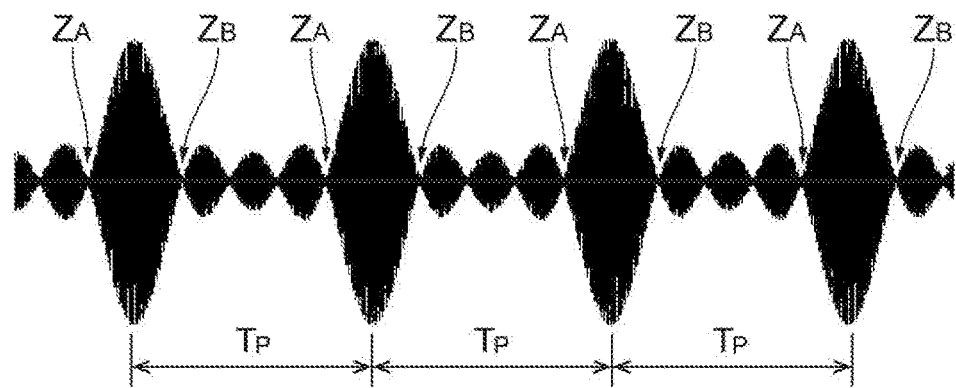
FIG. 8A is a diagram showing still another example of a waveform of a combined power of a plurality of power components.
Figure 8B:
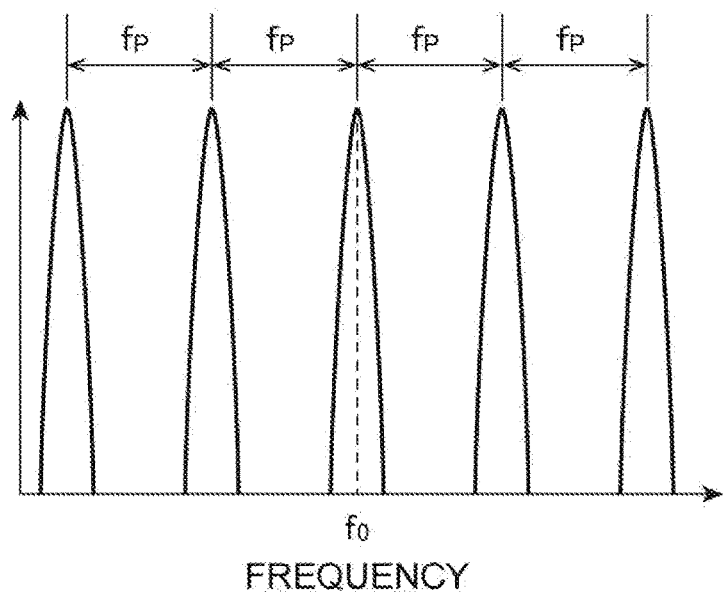
FIG. 8B is a diagram showing a power spectrum of the combined power shown in FIG. 8A.
Figure 8C:
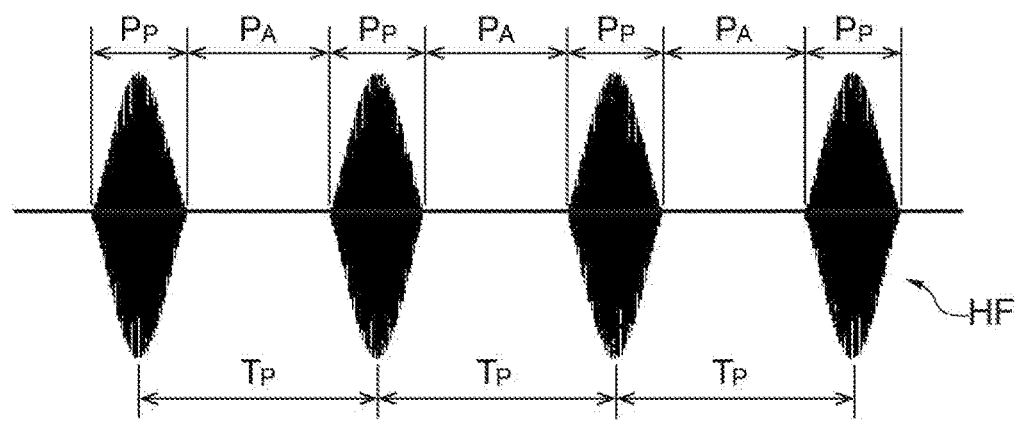
FIG. 8C is a diagram showing a waveform of radio frequency power HF of still another example.

Hereinafter, FIGS. 8A, 8B, and 8C will be referred to. In another example, as shown in FIG. 8B, the frequencies of the plurality of power components of the radio frequency power HF are $f_0-2 \times f_P$, $f_0-f_P$, $f_0$, $f_0+f_P$, and $f_0+2 \times f_P$. In this example, as shown in FIG. 8A, the envelope of the combined power of a plurality of power components includes four peak groups. In this example, as shown in FIG. 8C, the radio frequency power HF is composed of a peak group which includes the maximum peaks among the four peak groups.

As described above, the radio frequency power HF may be composed of two or more power components. The frequency of each of the two or more power components is set symmetrically with respect to the fundamental frequency $f_0$ and is set at an interval which is defined by a predetermined frequency $f_P$.

Figure 9:
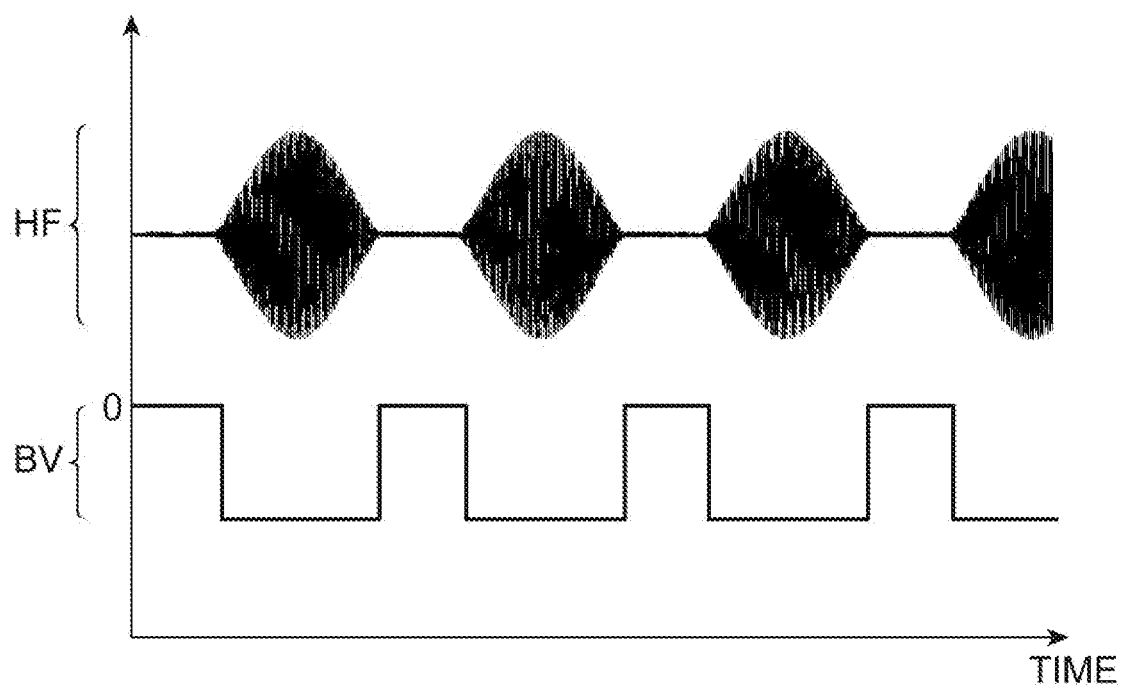
FIG. 9 is a diagram showing a voltage waveform of bias power of another example together with a waveform of radio frequency power HF of an example.

Hereinafter, FIG. 9 will be referred to. FIG. 9 is a diagram showing a voltage waveform of bias power of another example together with the waveform of the radio frequency power HF of an example. In another embodiment, the bias power source 81 may be a direct-current power source configured to repeatedly generate a pulsed negative direct-current voltage BV as the bias power BP.

The repetition frequency of the pulsed negative direct-current voltage BV is, for example, a frequency in a range of 1 kHz to 800 kHz. In an embodiment, the repetition frequency of the pulsed negative direct-current voltage BV is the frequency $f_P$. In this embodiment, the controller 80 may set the supply period (the period $P_P$) of the pulsed radio frequency power HF in the cycle of the direct-current voltage By. Specifically, the radio frequency power source 61 and the bias power source 81 are synchronized with each other by a clock signal which is provided from the controller 80 or another controller. The controller 80 or another controller provides a signal for setting the phase of the pulsed negative direct-current voltage BV to the bias power source 81 in order to set the phase difference between the radio frequency power HF and the pulsed negative direct-current voltage BY. The bias power source 81 outputs the pulsed negative direct-current voltage BV with a given phase. In this way, the supply period (the period $P_P$) of the pulsed radio frequency power HF in the cycle of the pulsed negative direct-current voltage BV can be set. The controller 80 may provide a signal for setting a phase to the radio frequency power source 61 to set the phase of the radio frequency power HF instead of the pulsed negative direct-current voltage By.

In the plasma processing apparatus 1, by adjusting the supply period of the pulsed radio frequency power HF in the cycle of the pulsed negative direct-current voltage BV, it is possible to adjust the energy of ions which are supplied to the substrate W. For example, if the pulsed radio frequency power HF is supplied in the period in which the pulsed negative direct-current voltage BV is not applied to the lower electrode 18, the energy of ions which are supplied to the substrate W decreases. On the other hand, if the pulsed radio frequency power HF is supplied in the period in which the pulsed negative direct-current voltage BV is applied to the lower electrode 18, the energy of ions which are supplied to the substrate W increases.

Figure 10:
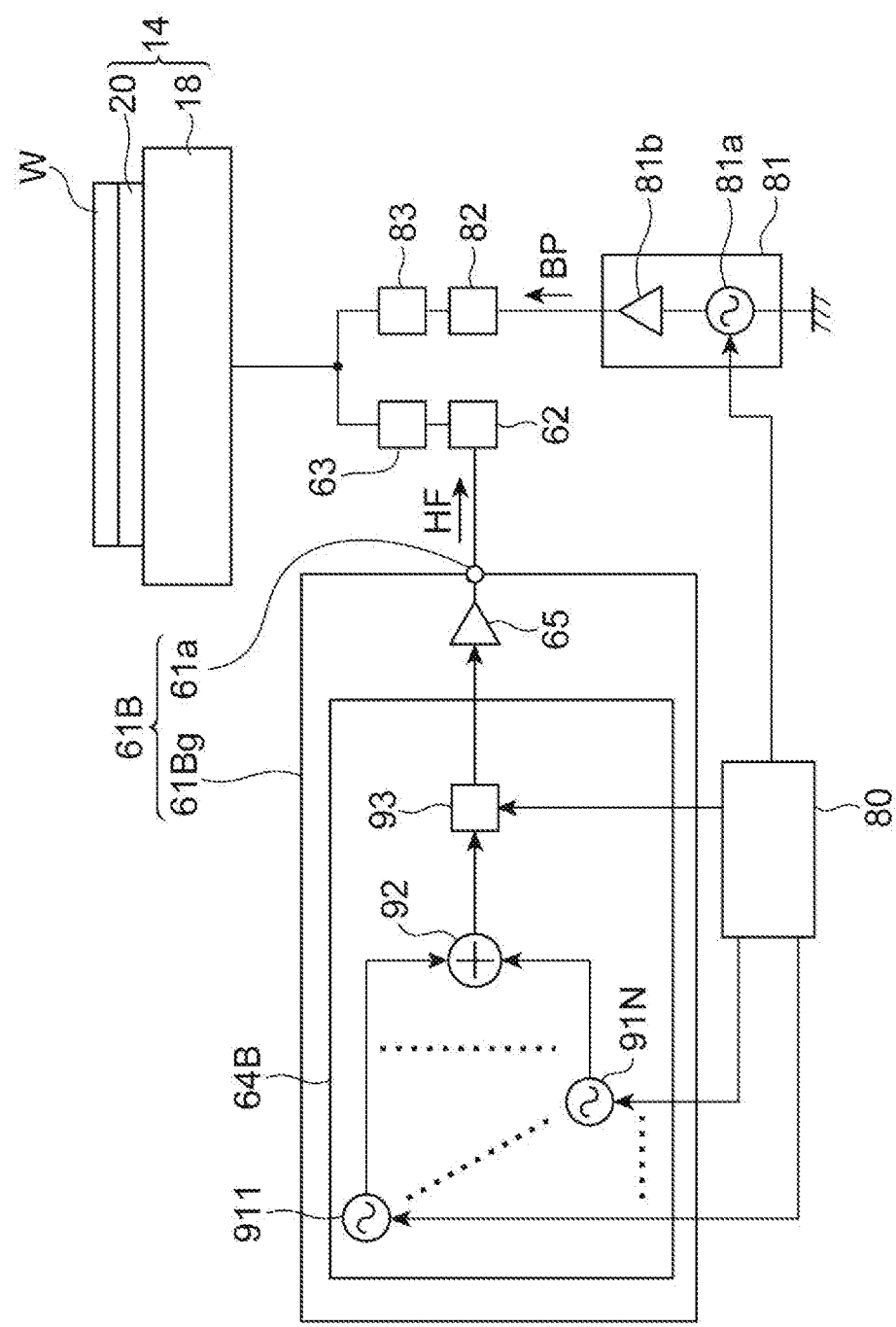
FIG. 10 is a diagram showing a configuration of a radio frequency power source according to another exemplary embodiment.

Hereinafter, FIG. 10 will be referred to. FIG. 10 is a diagram showing a configuration of a radio frequency power source according to another exemplary embodiment. As shown in FIG. 10, the plasma processing apparatus 1 may include a radio frequency power source 61B instead of the radio frequency power source 61. The radio frequency power source 61B includes a power generator 61Bg and the output 61a. The power generator 61Bg is configured to generate the radio frequency power HF. In the radio frequency power source 61B, the output 61a is configured to output the radio frequency power HF generated by the power generator 61Bg.

The power generator 61Bg has a modulated signal generator 64B. The power generator 61Bg may further include the amplifier 65. The modulated signal generator 64B generates a modulated radio frequency signal. The radio frequency power HF may be the modulated radio frequency signal which is generated by the modulated signal generator 64B. In this case, the amplifier 65 is not necessary. Alternatively, the radio frequency power HF may be generated by amplifying the modulated radio frequency signal by the amplifier 65.

The modulated signal generator 64B may include a plurality of signal generators 91₁ to 91N, an adder 92, and a switching circuit 93. Here, "N" is an integer of 2 or more. The plurality of signal generators 91₁ to 91N are configured to generate a plurality of radio frequency signals, respectively. The respective frequencies of the plurality of radio frequency signals are set symmetrically with respect to the fundamental frequency $f_0$. The respective frequencies of the plurality of radio frequency signals are set at the interval of the predetermined frequency $f_P$.

The adder 92 is configured to add the plurality of radio frequency signals from the plurality of signal generators 91₁ to 91N to generate a composite signal. The envelope of the composite signal has peaks that periodically appear at the time interval $T_P$. The switching circuit 93 is configured to generate the modulated radio frequency signal from the composite signal. The modulated radio frequency signal is set such that the amplitude level thereof is zero in the period $P_A$ excluding the period $P_P$ between the zero-cross region $Z_A$ of the envelope immediately before the point in time of appearance of each peak of the envelope of the composite signal and the zero-cross region $Z_B$ of the envelope immediately after the point in time of the appearance. The radio frequency power source 61B is also able to generate the radio frequency power HF, similarly to the radio frequency power source 61.

While various exemplary embodiments have been described above, various additions, omissions, substitutions and changes may be made without being limited to the exemplary embodiments described above. Elements of the different embodiments may be combined to form another embodiment.

In another embodiment, the plasma processing apparatus may be another type of plasma processing apparatus such as an inductively coupled plasma processing apparatus. In the inductively coupled plasma processing apparatus, the radio frequency power HF is supplied to an antenna for generating an inductively coupled plasma.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A radio frequency power source for a plasma processing apparatus, comprising:
   a single power generator configured to generate radio frequency power, the radio frequency power being a composite radio frequency power including a plurality of power components respectively having a plurality of frequencies, the plurality of frequencies being set symmetrically with respect to a fundamental frequency at an interval of a predetermined frequency which is lower than the fundamental frequency, an envelope of the radio frequency power having peaks that periodically appear at a time interval defined by the predetermined frequency or a frequency that is a multiple of twice or more the predetermined frequency, and a power level of the radio frequency power being set to be zero in a period excluding a period between a zero-cross region of the envelope immediately before a point in time of appearance of each of the peaks and a zero-cross region of the envelope immediately after the point in time of the appearance; and
   a single output configured to output the radio frequency power generated by the power generator.

2. The radio frequency power source according to claim 1, wherein the power generator includes:
   a waveform data generator;
   a quantizer configured to quantize waveform data generated by the waveform data generator to generate quantized data;
   an inverse Fourier transformer configured to generate I data and Q data by applying inverse Fourier transform to the quantized data; and
   a modulator configured to generate a modulated radio frequency signal by modulating two reference radio frequency signals of which phases are different from each other by 90° by using the I data and the Q data, and
   the power generator is configured to generate the radio frequency power from the modulated radio frequency signal.

3. The radio frequency power source according to claim 2, wherein the power generator further includes an amplifier configured to amplify the modulated radio frequency signal to generate the radio frequency power.

4. The radio frequency power source according to claim 1, wherein the power generator includes:
   a plurality of signal generators configured to generate a plurality of radio frequency signals, respectively, the plurality of radio frequency signals having the plurality of frequencies, respectively;
   an adder configured to add the plurality of radio frequency signals to generate a composite signal of which an envelope has peaks that periodically appear at the time interval; and
   a switching circuit configured to generate, from the composite signal, a modulated radio frequency signal of which amplitude level is zero in a period excluding a period between a zero-cross region of the envelope of the composite signal immediately before a point in time of appearance of each of the peaks of the envelope of the composite signal and a zero-cross region of the envelope of the composite signal immediately after the point in time of the appearance, and
   the power generator is configured to generate the radio frequency power from the modulated radio frequency signal generated by the switching circuit.

5. The radio frequency power source according to claim 4, wherein the power generator further includes an amplifier configured to amplify the modulated radio frequency signal generated by the switching circuit to generate the radio frequency power.

6. A plasma processing apparatus comprising:
   a chamber;
   a substrate support having a lower electrode and configured to support a substrate within the chamber; and
   the radio frequency power source according to claim 1, configured to generate radio frequency power to generate a plasma from a gas in the chamber.

7. The plasma processing apparatus according to claim 6, further comprising a bias power source electrically connected to the lower electrode and configured to generate radio frequency bias power to draw ions into the substrate support,
   wherein a frequency of the radio frequency bias power is the predetermined frequency.

8. The plasma processing apparatus according to claim 7, further comprising a controller configured to set a phase difference between the radio frequency power and the radio frequency bias power.

9. The plasma processing apparatus according to claim 6, further comprising a bias power source electrically connected to the lower electrode and configured to repeatedly generate a pulsed direct-current voltage to draw ions into the substrate support,
   wherein a repetition frequency of the pulsed direct-current voltage is the predetermined frequency.

10. The plasma processing apparatus according to claim 9, further comprising a controller configured to set a phase difference between the radio frequency power and the pulsed direct-current voltage.

* * * * *